(12) United States Patent
Lin et al.

(10) Patent No.: US 12,174,270 B2
(45) Date of Patent: Dec. 24, 2024

(54) MAGNETIC SENSOR

(71) Applicant: TDK CORPORATION, Tokyo (JP)

(72) Inventors: Chengbin Lin, Tokyo (JP); Takato Fukui, Tokyo (JP)

(73) Assignee: TDK CORPORATION, Tokyo (JP)

( * ) Notice: Subject to any disclaimer, the term of this patent is extended or adjusted under 35 U.S.C. 154(b) by 133 days.

(21) Appl. No.: 18/107,158

(22) Filed: Feb. 8, 2023

(65) Prior Publication Data

US 2023/0258741 A1 Aug. 17, 2023

(51) Int. Cl.
*G01R 33/00* (2006.01)

(52) U.S. Cl.
CPC ................. *G01R 33/0017* (2013.01)

(58) Field of Classification Search
CPC .......... G01R 33/0017; G01R 33/09; G01R 33/0011; G01R 33/093; G01R 33/095
USPC ....................... 324/226, 225, 200
See application file for complete search history.

(56) References Cited

U.S. PATENT DOCUMENTS

| | | | |
|---|---|---|---|
| 11,002,805 B2* | 5/2021 | Uchida | ............ G01R 33/0094 |
| 2003/0042902 A1 | 3/2003 | Kobayashi | |
| 2012/0062215 A1 | 3/2012 | Ide | |
| 2013/0141090 A1 | 6/2013 | Sidman | |
| 2015/0048819 A1 | 2/2015 | Kawakami | |
| 2020/0116801 A1* | 4/2020 | Watanabe | ............ G01R 33/07 |
| 2020/0355758 A1 | 11/2020 | Tanabe et al. | |
| 2022/0342011 A1* | 10/2022 | Kuroki | ............ G01R 33/0017 |

FOREIGN PATENT DOCUMENTS

| | | |
|---|---|---|
| EP | 3184955 A1 | 6/2017 |
| JP | 6299069 B2 | 3/2018 |
| JP | 2018179738 A | 11/2018 |
| WO | 2021131606 A1 | 7/2021 |

OTHER PUBLICATIONS

Extended European Search Report in EP Application 23156994.8 dated Jun. 30, 2023 (7 pages).

* cited by examiner

*Primary Examiner* — Giovanni Astacio-Oquendo
(74) *Attorney, Agent, or Firm* — YOUNG LAW FIRM, P.C.

(57) ABSTRACT

Disclosed herein is a magnetic sensor that includes first and second magnetic layers opposed to each other through a magnetic gap, a magnetosensitive element disposed on a magnetic path formed by the magnetic gap, and a compensating coil wound around the first and second magnetic layers. The first magnetic layer, second magnetic layer, magnetosensitive element, and compensating coil are integrated in a sensor chip.

15 Claims, 14 Drawing Sheets

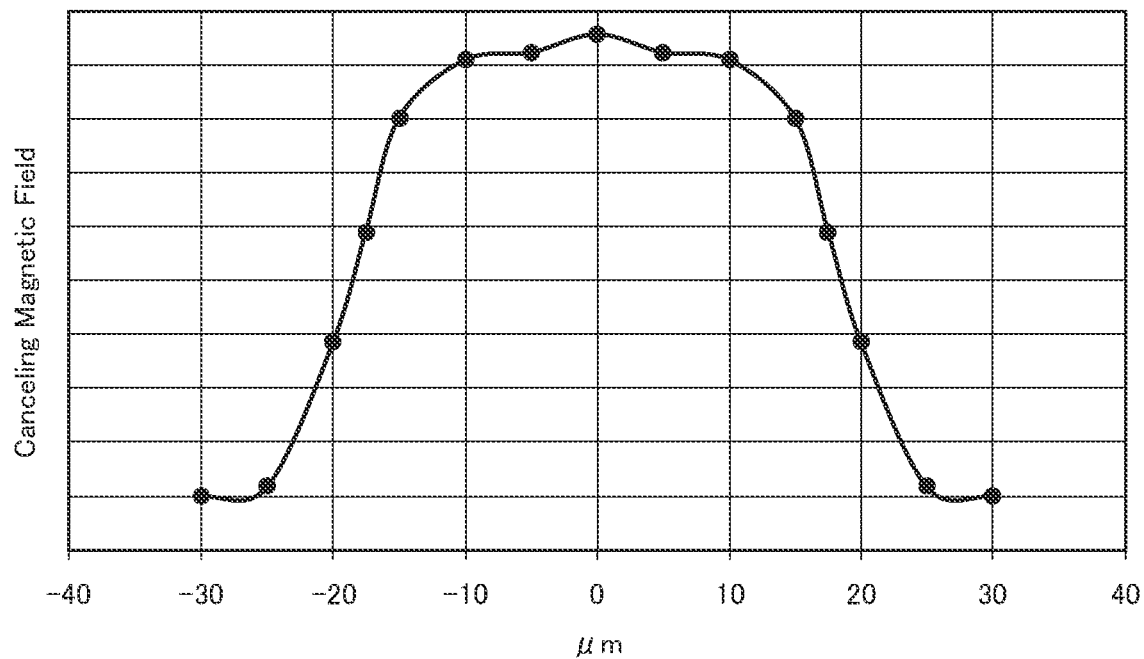
FIG. 16
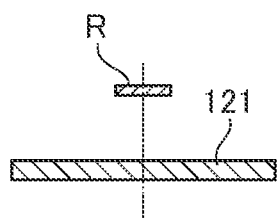 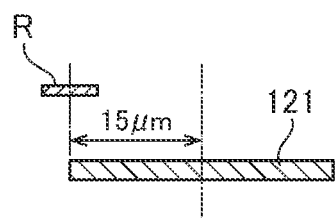 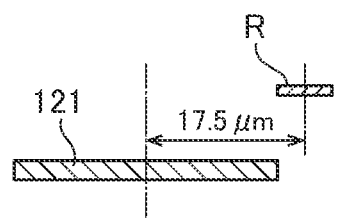
FIG. 17A  FIG. 17B  FIG. 17C

MAGNETIC SENSOR

BACKGROUND OF THE ART

Field of the Art

The present disclosure relates to a magnetic sensor and, more particularly, to a magnetic sensor having a compensating coil for canceling a magnetic field to be detected.

Description of Related Art

JP 2018-179738A discloses a magnetic sensor having a compensating coil for canceling a magnetic field to be detected. In the magnetic sensor disclosed in JP 2018-179738A, the compensating coil is disposed at a position overlapping a magnetosensitive element so as to be wound along the magnetosensitive element.

However, the compensating coil described in JP 2018-179738A has low generation efficiency of a canceling magnetic field, so that in order to generate a sufficient canceling magnetic field, it is necessary to make a large current flow in the compensating coil. This disadvantageously not only increases power consumption but also increases thermal noise of the magnetosensitive element due to heat generation of the compensating coil.

SUMMARY

It is therefore an object of the present disclosure to provide a magnetic sensor with improved generation efficiency of a cancelling magnetic field.

A magnetic sensor according to the present disclosure includes: first and second magnetic layers opposed to each other through a magnetic gap; a magnetosensitive element disposed on a magnetic path formed by the magnetic gap; and a compensating coil wound around the first and second magnetic layers, wherein the first magnetic layer, second magnetic layer, magnetosensitive element, and compensating coil are integrated in a sensor chip.

BRIEF DESCRIPTION OF THE DRAWINGS

The above features and advantages of the present disclosure will be more apparent from the following description of certain preferred embodiments taken in conjunction with the accompanying drawings, in which:

FIG. 16 is a graph illustrating the relation between the positional relation between the magnetosensitive element R and the lower layer pattern 121 in the X-direction and the generation efficiency of a canceling magnetic field;

FIGS. 17A to 17C are schematic diagrams for explaining a positional relation in the X-direction between the magnetosensitive element R and the lower layer pattern 121;

DETAILED DESCRIPTION OF THE EMBODIMENTS

Preferred embodiments of the present disclosure will be explained below in detail with reference to the accompanying drawings.

Figure 1:
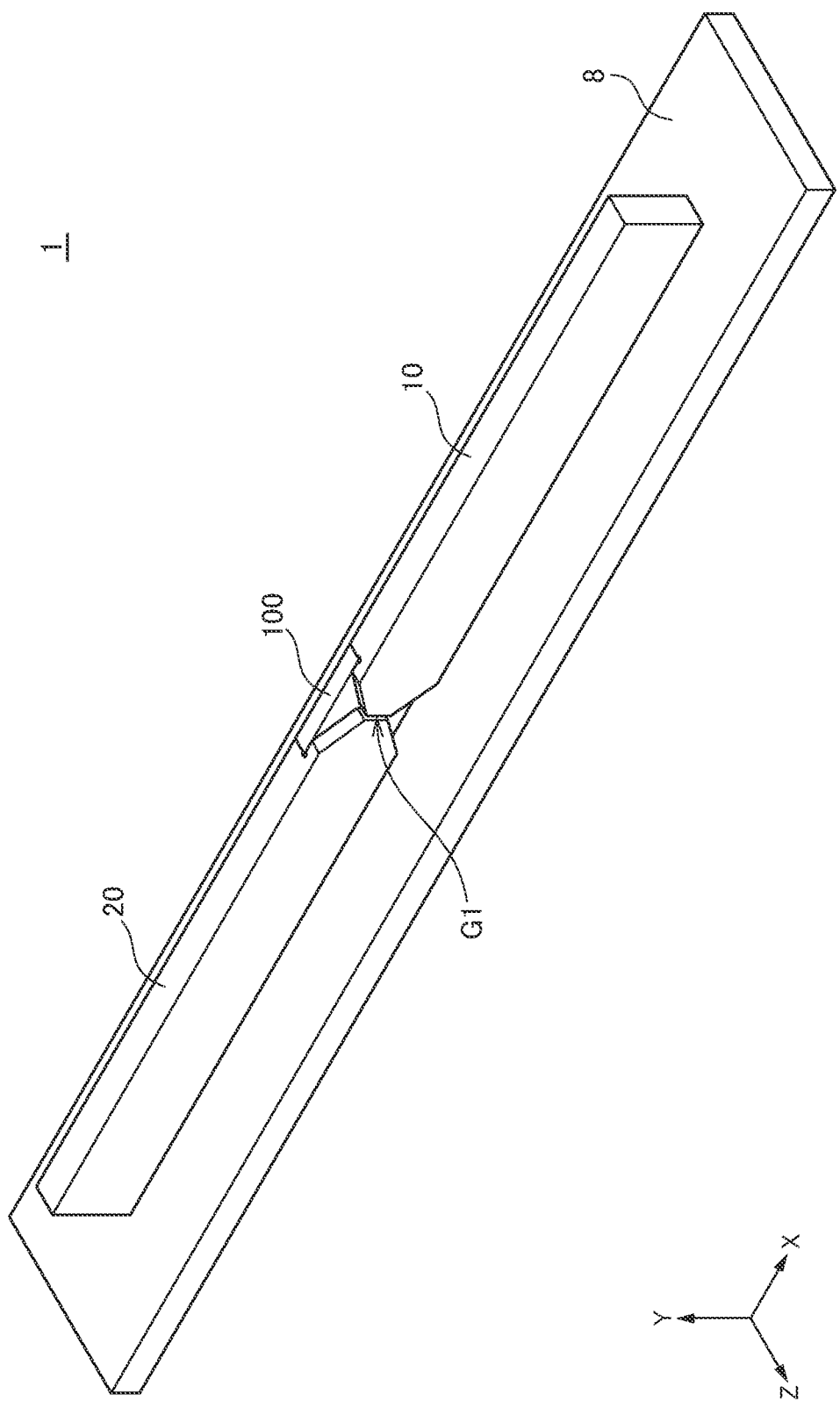
FIG. 1 is a schematic perspective view illustrating the outer appearance of a magnetic sensor 1 according to an embodiment of the present disclosure.
Figure 2:
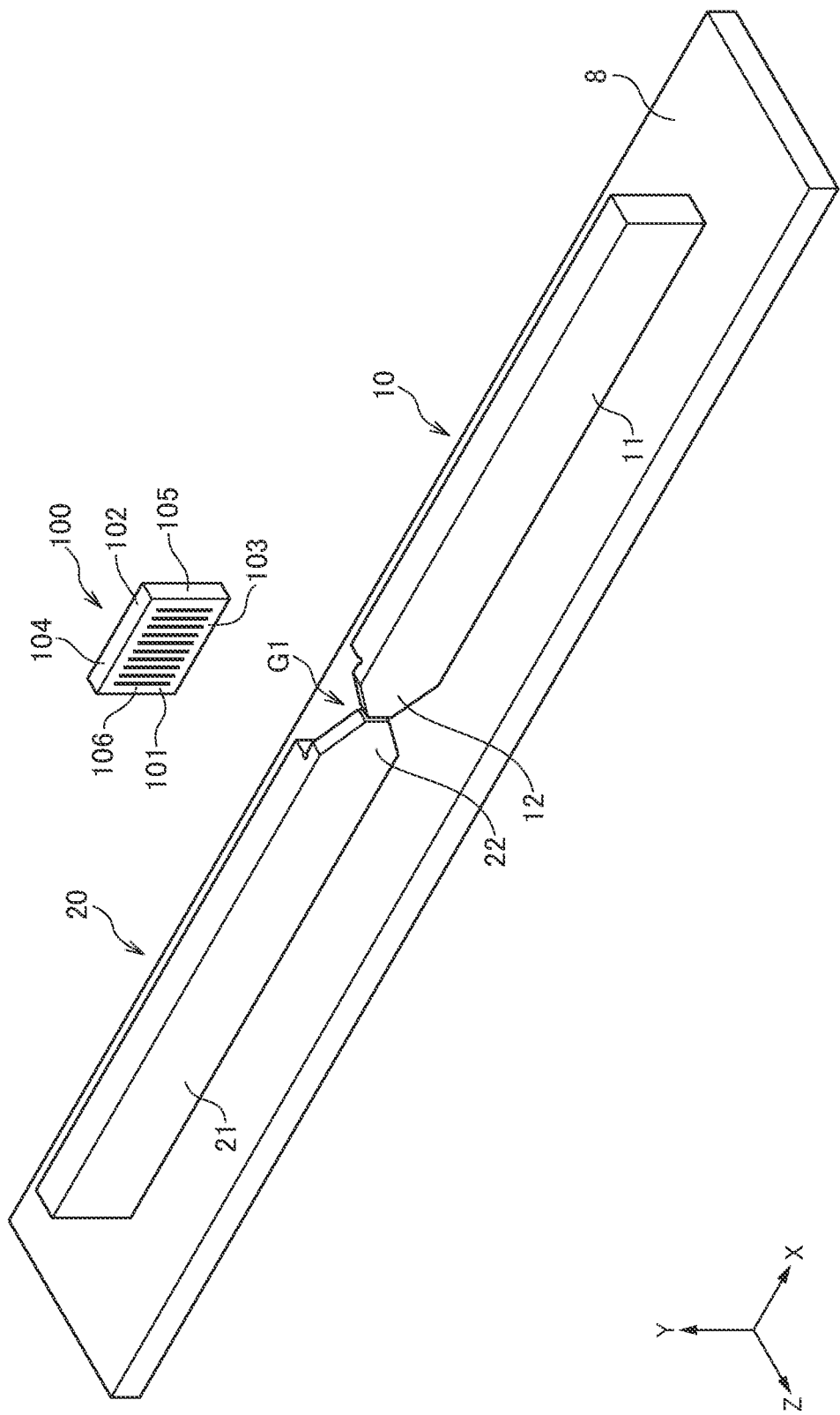
FIG. 2 is a schematic exploded perspective view of the magnetic sensor 1.

FIG. 1 is a schematic perspective view illustrating the outer appearance of a magnetic sensor 1 according to an embodiment of the present disclosure. FIG. 2 is a schematic exploded perspective view of the magnetic sensor 1.

As illustrated in FIGS. 1 and 2, the magnetic sensor 1 according to the present embodiment includes a substrate 8, a sensor chip 100, and external magnetic members 10 and 20. The sensor chip 100 and external magnetic members 10 and 20 are mounted on the substrate 8. The substrate 8 whose XZ surface is a main surface thereof mounts thereon the sensor chip 100 and external magnetic members 10 and 20. The sensor chip 100 has an element formation surface 101 and a back surface 102 which constitute the XY surface and are positioned on the opposite sides, a mounting surface 103 and an upper surface 104 which constitute the XZ surface and are positioned on opposite sides, and side surfaces 105 and 106 which constitute the YZ surface and are positioned on opposite sides. The sensor chip 100 is erected on the substrate 8 such that the mounting surface 103 faces the main surface of the substrate 8.

The external magnetic members 10 and 20 are each made of a high permeability material such as ferrite. The external magnetic member 10 is constituted by a bar-like main body part 11 elongated in the X-direction and a protruding part 12 provided at the end portion of the main body part 11 in the X-direction. Similarly, the external magnetic member 20 is constituted by a bar-like main body part 21 elongated in the X-direction and a protruding part 22 provided at the end portion of the main body part 21 in the X-direction. The main body part 11 and the protruding part 12 may be formed integrally or constituted by separated blocks. The same applies to the main body part 21 and the protruding part 22.

The thickness of each of the protruding parts 12 and 22 in the Z-direction is smaller than the thickness of each of the main body parts 11 and 21 in the Z-direction. As illustrated in FIG. 1, the sensor chip 100 and external magnetic member 10 are positioned on the substrate 8 such that a part of the element formation surface 101 of the sensor chip 100 is covered with the protruding part 12 of the external magnetic member 10 and that the side surface 105 of the sensor chip 100 is covered with the x-direction end face of the main body part 11 of the external magnetic member 10. Similarly, the sensor chip 100 and external magnetic member 20 are positioned on the substrate 8 such that another part of the element formation surface 101 of the sensor chip 100 is covered with the protruding part 22 of the external magnetic member 20 and that the side surface 106 of the sensor chip 100 is covered with the x-direction end face of the main body part 21 of the external magnetic member 20. As a result, a magnetic gap G1 is formed between the protruding parts 12 and 22.

Figure 3:
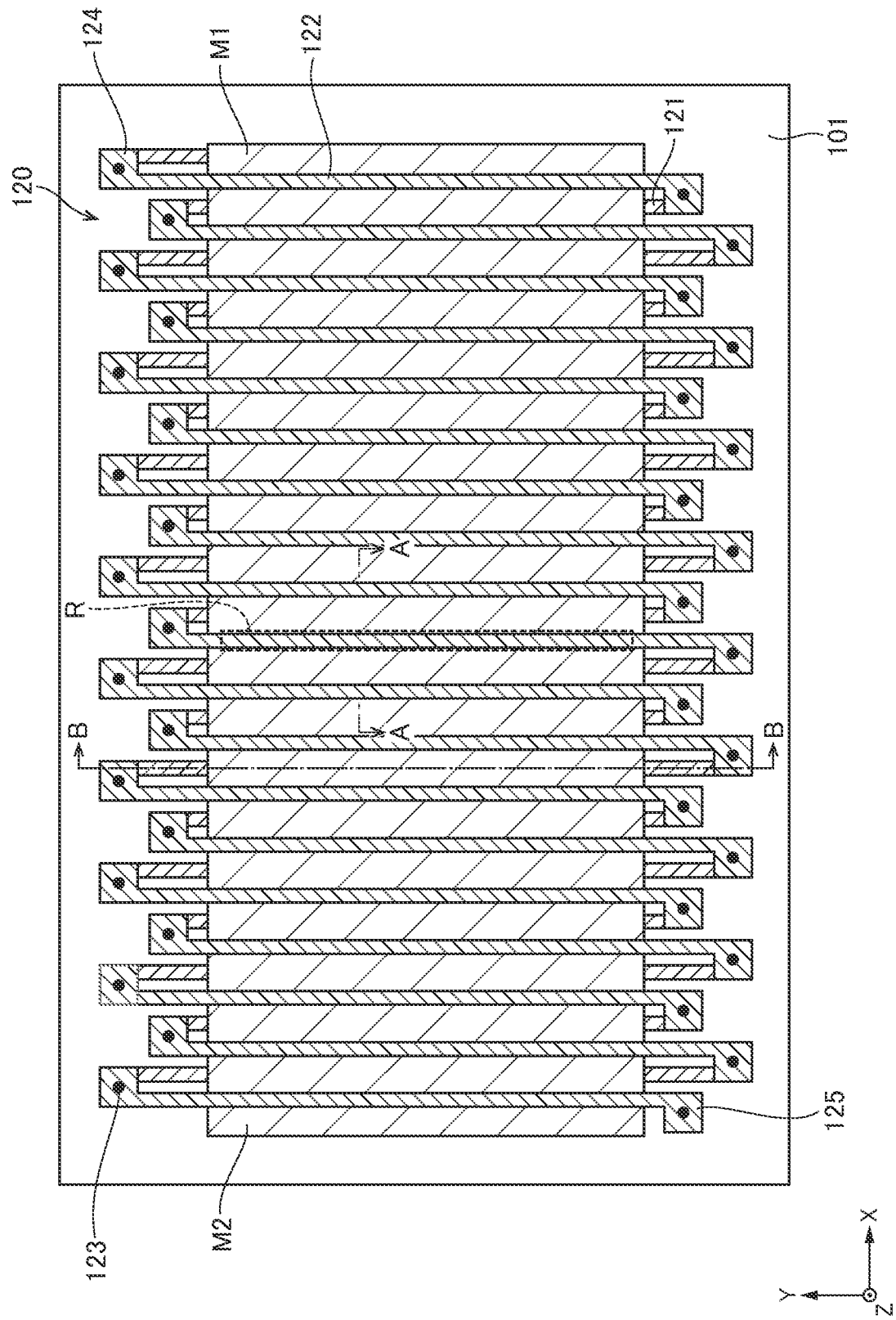
FIG. 3 is a schematic plan view for explaining the configuration of the element formation surface 101 of the sensor chip 100.
Figure 4:
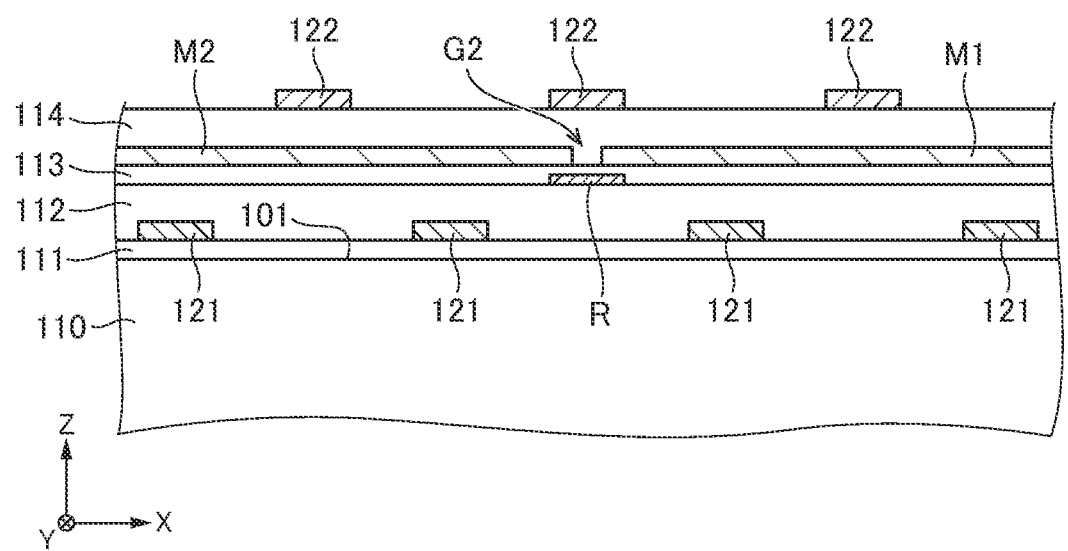
FIG. 4 is a schematic cross-sectional view taken along the line A-A in FIG. 3.

FIG. 3 is a schematic plan view for explaining the configuration of the element formation surface 101 of the sensor chip 100. FIG. 4 is a schematic cross-sectional view taken along the line A-A in FIG. 3, and FIG. 5 is a schematic cross-sectional view taken along the line B-B in FIG. 3.

Figure 5:
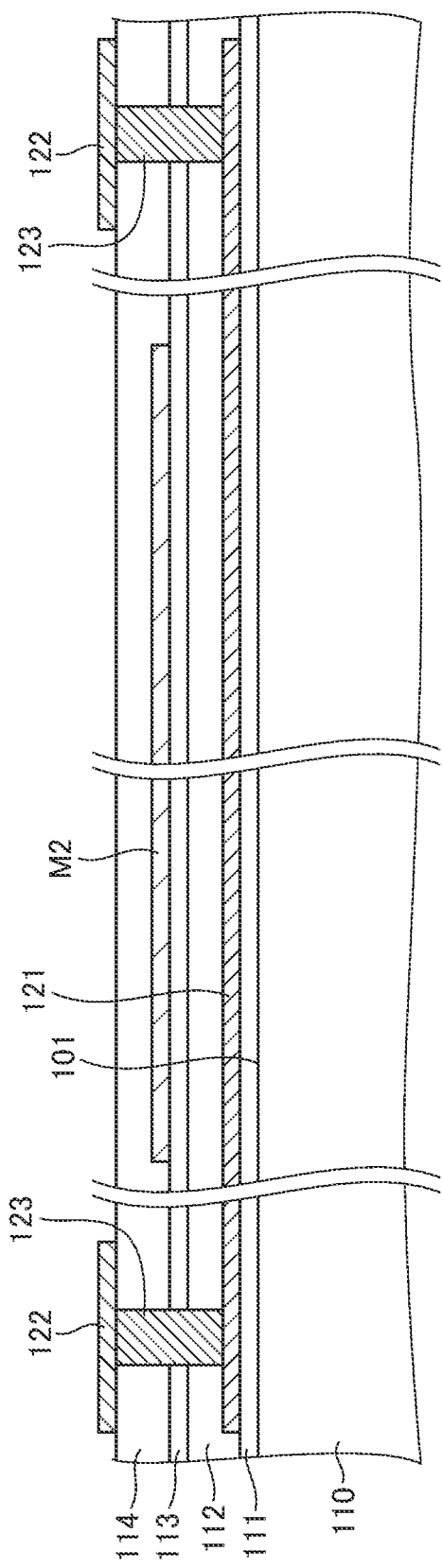
FIG. 5 is a schematic cross-sectional view taken along the line B-B in FIG. 3.
Figure 6:
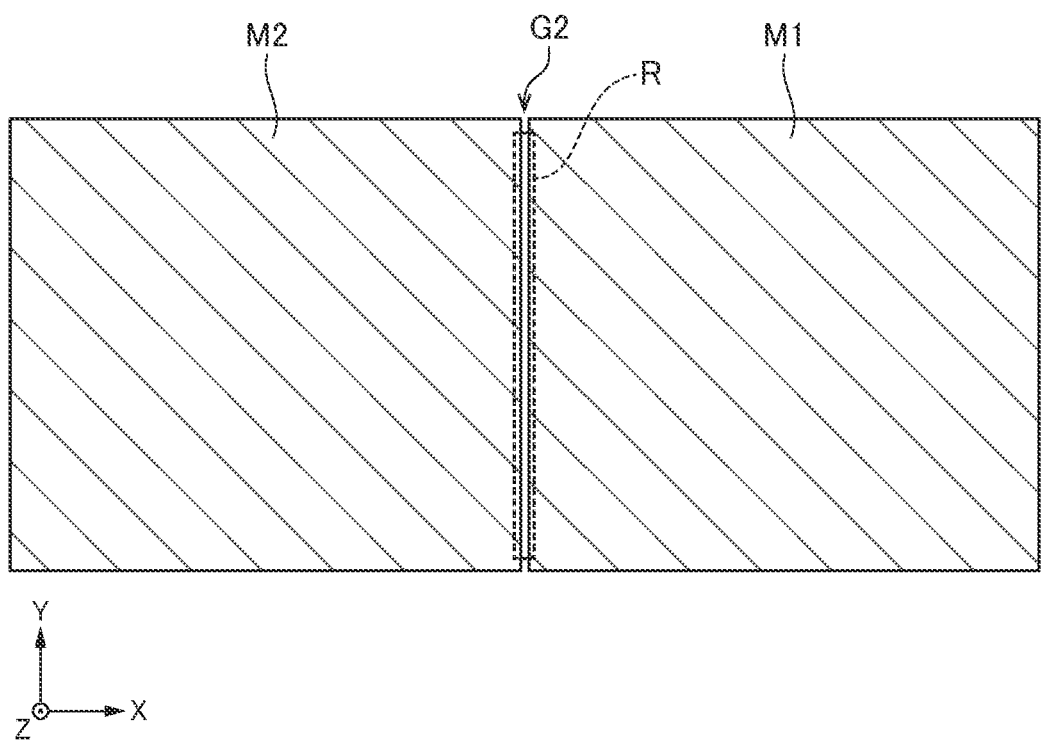
FIG. 6 is a schematic plan view for explaining a positional relation between the magnetic layers M1, M2 and the magnetosensitive element R.

As illustrated in FIGS. 3 to 5, there are provided, on the element formation surface 101 of the sensor chip 100, magnetic layers M1, M2, a magnetosensitive element R, and a compensating coil 120 wound around the magnetic layers M1 and M2. The magnetosensitive element R is not particularly limited to a specific element as long as it varies in electrical resistance depending on the direction of magnetic flux and may be, for example, an MR element. The fixed magnetization direction which is the sensitivity axis direction of the magnetosensitive element R is the X-direction. The magnetic layers M1 and M2 are each a thin film made of an NiFe-based material such as permalloy. As illustrated in FIG. 6, the magnetic layers M1 and M2 are arranged in the X-direction through a magnetic gap G2 extending in the Y-direction, and the magnetosensitive element R is disposed at a position overlapping the magnetic gap G2 in a plan view as viewed in the Z-direction. The width of the magnetic gap G2 in the X-direction is smaller than the that of the magnetic gap G1. The magnetic layer M1 is covered with the protruding part 12 of the external magnetic member 10, and the magnetic layer M2 is covered with the protruding part 22 of the external magnetic member 20. As a result, a magnetic field in the X-direction collected by the external magnetic members 10 and 20 passes through the magnetic gap G2 in the X-direction and is applied to the magnetosensitive element R.

The sensor chip 100 has a chip main body 110 constituting the element formation surface 101 and four insulating layers 111, 112, 113, and 114 stacked in this order on the surface of the chip main body 110. On the surface of the insulating layer 111 constituting the first layer, a plurality of lower layer patterns 121 constituting the compensating coil 120 are provided. On the surface of the insulating layer 112 constituting the second layer, the magnetosensitive element R is provided. On the surface of the insulating layer 113 constituting the third layer, the magnetic layers M1 and M2 are provided. On the surface of the insulating layer 114 constituting the fourth layer, a plurality of upper layer patterns 122 constituting the compensating coil 120 are provided. The end portions of the lower layer patterns 121 in the Y-direction and the end portions of the upper layer patterns 122 in the Y-direction are connected to each other by a plurality of via conductors 123 penetrating the insulating layers 112 to 114.

The lower and upper layer patterns 121 and 122 are conductor patterns extending in the Y-direction and overlapping the magnetic layers M1 and M2 except at both ends each thereof. The both ends of each of the lower and upper layer patterns 121 and 122 in the Y-direction constitute a connection pad with a size increased in the X-direction, in which a via conductor 123 is formed. The lower layer patterns 121 are positioned below the magnetic layers M1 and M2, i.e., on the negative Z-direction side, and the upper layer patterns 122 are positioned above the magnetic layers M1 and M2, i.e., on the positive Z-direction side. These lower and upper layer patterns 121 and 122 are connected through the via conductors 123, whereby the compensating coil 120 constituted by a single continuous coil pattern is formed. In FIG. 3, connection pads 124 and 125 serve as one end and the other end of the compensating coil 120, respectively. With this configuration, the magnetic layers M1 and M2 are disposed in the inner diameter area of the compensating coil 120, so that when a current is made to flow in the compensating coil 120, a canceling magnetic field thus generated is applied to the magnetosensitive element R through the magnetic layers M1 and M2. The compensating coil 120 cancels the magnetic field to be applied to the magnetosensitive element R for so-called closed-loop control. The magnetic layers M1 and M2 have a high permeability, so that much magnetic flux can be applied to the magnetosensitive element R with a small current.

Figure 7:
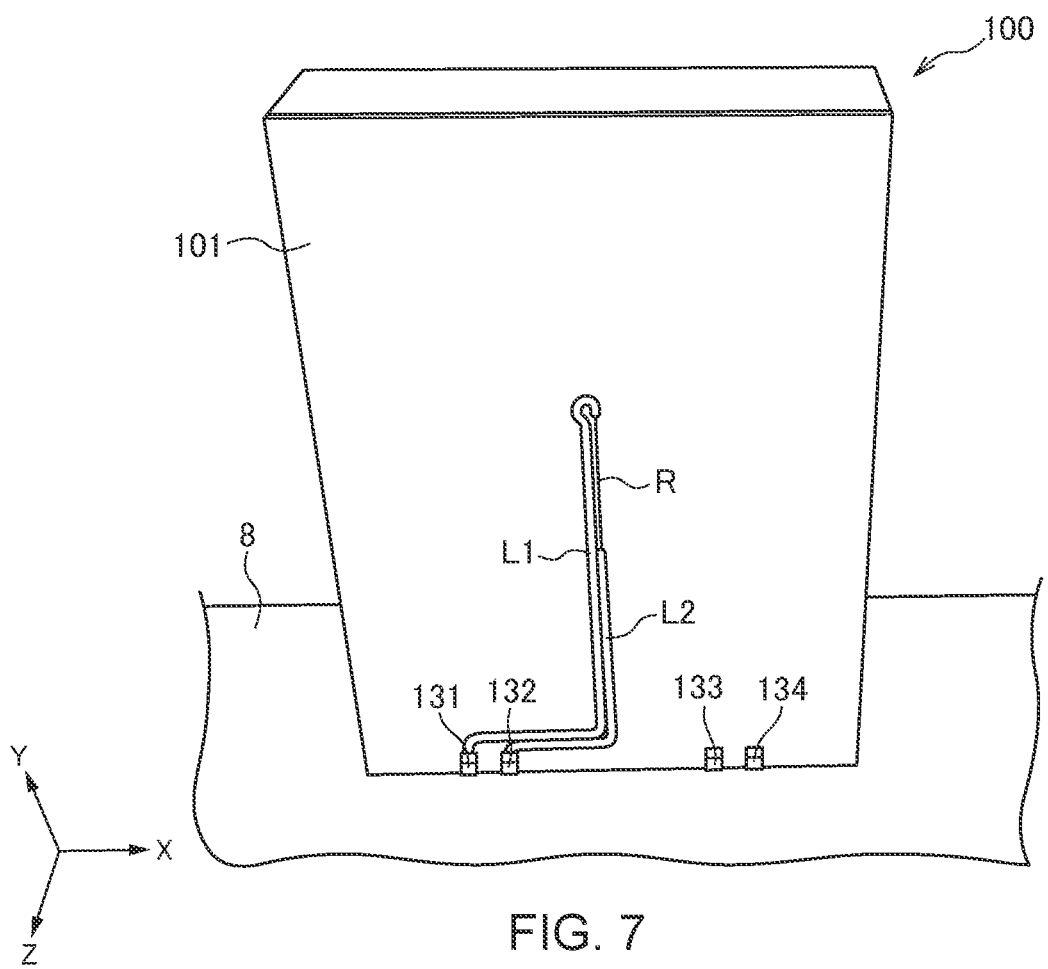
FIG. 7 is a schematic perspective view illustrating a state where the magnetic layers M1, M2 and compensating coil 120 are removed from the sensor chip 100.

FIG. 7 is a schematic perspective view illustrating a state where the magnetic layers M1, M2 and compensating coil 120 are removed from the sensor chip 100.

As illustrated in FIG. 7, the magnetosensitive element R extends in the Y-direction on the element formation surface 101, and one end and the other end thereof are connected to terminal electrodes 131 and 132 respectively through lines L1 and L2. Terminal electrodes 133 and 134 are connected respectively to the connection pads 124 and 125 of the compensating coil 120.

Figure 8:
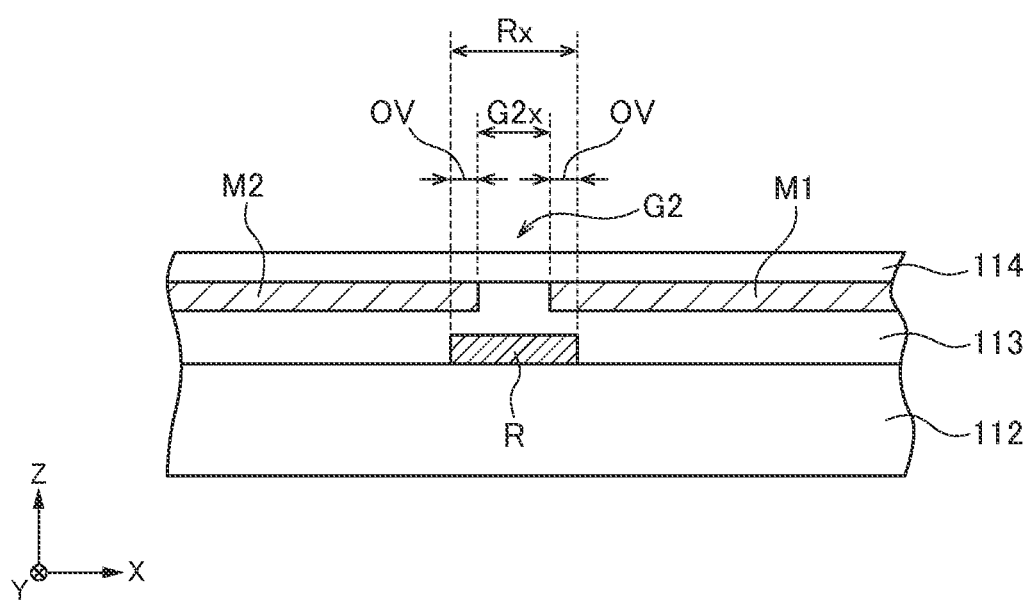
FIG. 8 is an XZ cross-sectional view of the main portion of the sensor chip 100.

FIG. 8 is an XZ cross-sectional view of the main portion of the sensor chip 100.

As illustrated, the magnetosensitive element R is positioned between the magnetic layers M1 and M2 in a plan view in the Z-direction. Thus, a magnetic field passing through the magnetic gap G2 is applied to the magnetosensitive element R. That is, the magnetosensitive element R is disposed in the vicinity of the magnetic gap G2 formed by the magnetic layers M1 and M2 and on a magnetic path where a magnetic field to be detected passing through the magnetic gap G2 can be detected. As described above, the magnetosensitive element R need not necessarily be disposed between the magnetic layers M1 and M2 but only needs to be disposed so as to allow at least a part of the magnetic field passing through the magnetic gap G2 formed by the magnetic layers M1 and M2 to be applied to the magnetosensitive element R. There is no particular restriction on the relation between the width of the magnetic gap G2 and the width of the magnetosensitive element R. In the example illustrated in FIG. 8, a width G2x of the magnetic gap G2 in the X-direction is smaller than a width Rx of the magnetosensitive element R in the X-direction, whereby the magnetic layers M1 M2 have an overlap OV with the magnetosensitive element R in the Z-direction. In order for more of the magnetic field that passes through the magnetic gap G2 to be applied to the magnetosensitive element R, the distance between the magnetic layers M1, M2 and the magnetosensitive element R in the Z-direction is desirably as small as possible at the overlap OV and is more desirably smaller than the width G2x of the magnetic gap G2 in the X-direction. This allows the magnetosensitive element R to serve as a main magnetic path for the magnetic field passing through the magnetic gap G2.

Figure 9:
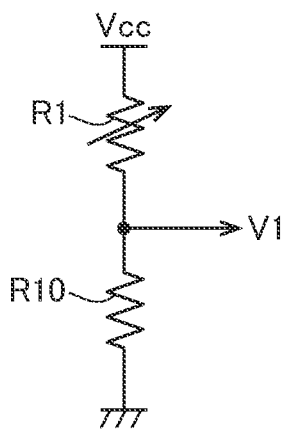
FIG. 9 is a circuit diagram of a circuit for obtaining a detection signal V1.
Figure 10:
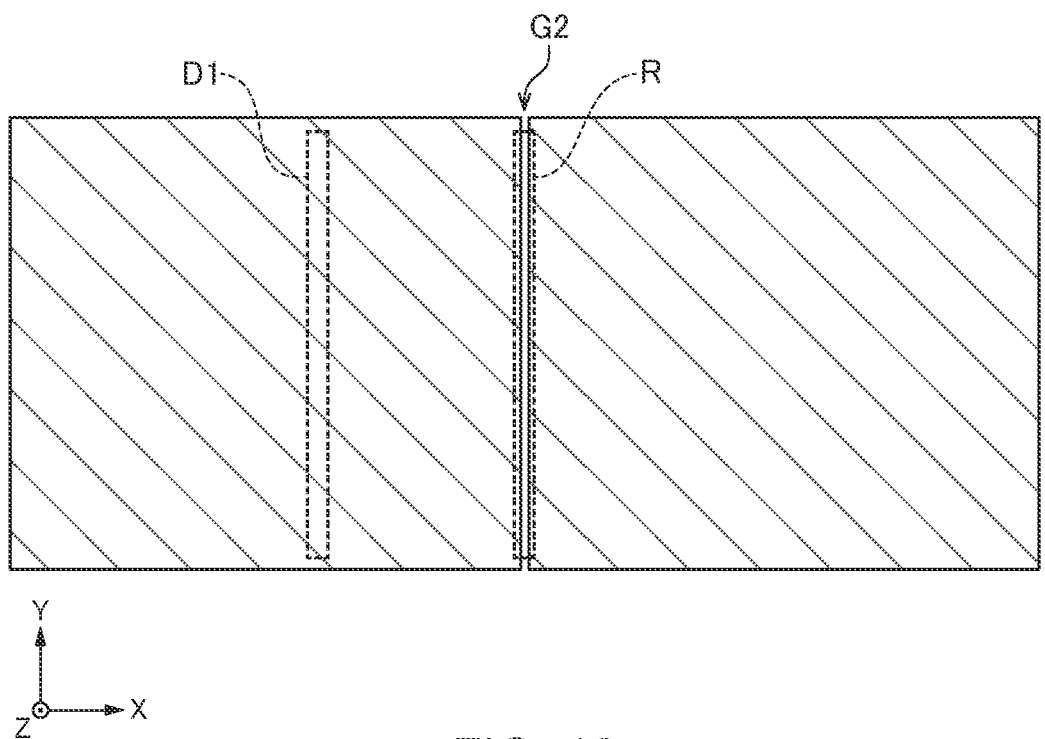
FIG. 10 is a schematic plan view for explaining a position where a dummy element D1 is arranged.

As illustrated in FIG. 9, when the magnetosensitive element R and a fixed resistor R10 are connected in series, a detection signal V1 can be obtained from the connection point therebetween. Then, making a compensating current based on the detection signal V1 flow in the compensating coil 120 allows closed-loop control to be achieved. The fixed resistor R10 may be provided on the sensor chip 100 or the substrate 8. In the former case, as illustrated in FIG. 10, a dummy element D1 having the same configuration as the magnetosensitive element R may be provided at a position completely overlapping the magnetic layer M1 or M2 and used as the fixed resistor R10. Although the dummy element D1 has the same configuration as the magnetosensitive element R, it is applied with substantially no magnetic field in the X-direction (magnetization direction) due to complete overlap with the magnetic layer M1 or M2 and can thus be used as the fixed resistor.

Figure 11:
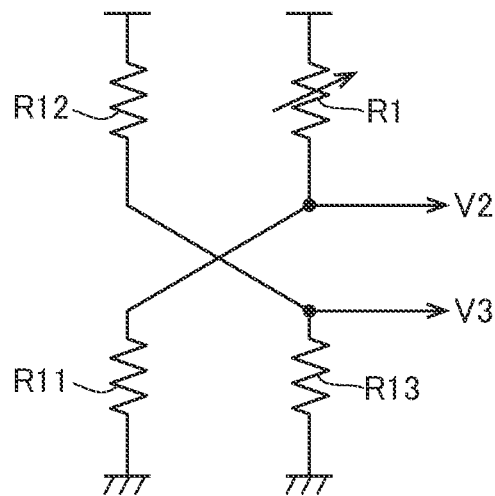
FIG. 11 is a circuit diagram of a circuit for obtaining detection signals V1 and V2.
Figure 12:
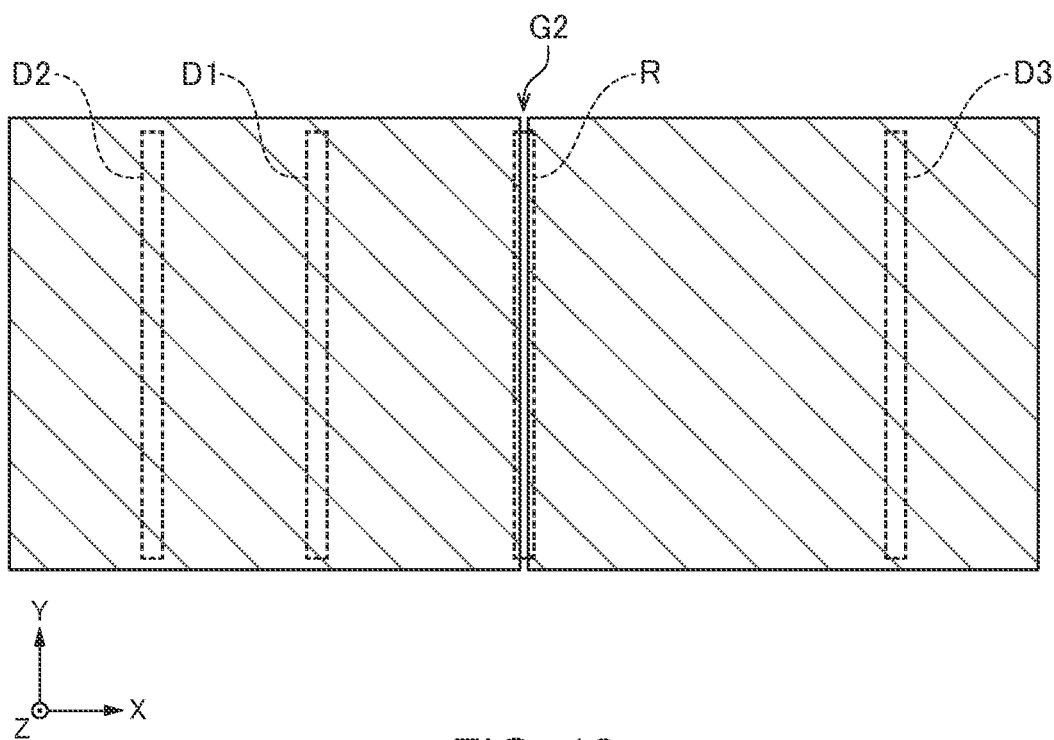
FIG. 12 is a schematic plan view for explaining a position where dummy elements D1 to D3 are arranged.

Alternatively, as illustrated in FIG. 11, the magnetosensitive element R and fixed resistors R11 to R13 may be bridge-connected so as to obtain detection signals V2 and V3. In this case, as illustrated in FIG. 12, dummy elements D1 to D3 having the same configuration as the magnetosensitive element R may be provided at positions completely overlapping the magnetic layer M1 or M2 and used as the fixed resistors R11 to R13.

As described above, in the magnetic sensor 1 according to the present embodiment, the compensating coil 120 is wound around the magnetic layers M1 and M2, so that the generation efficiency of a canceling magnetic field by the compensating coil 120 is improved. This reduces the amount of current to be made to flow in the compensating coil 120, so that it is possible to reduce not only power consumption but also thermal noise of the magnetosensitive element R. In addition, the magnetic layers M1, M2, magnetosensitive element R, and compensating coil 120 are integrated in the sensor chip 100, so that the number of components does not increase.

Figure 13:
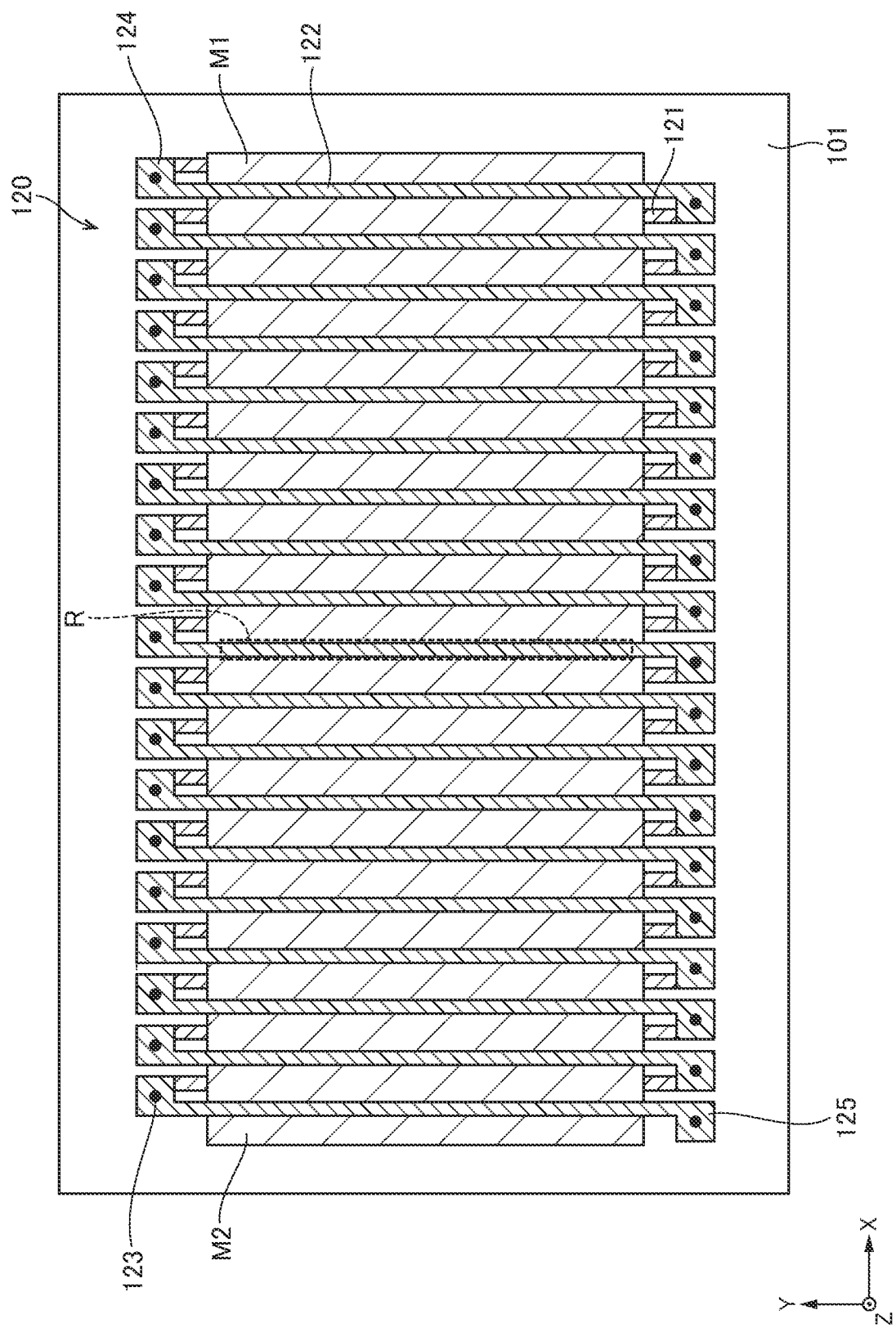
FIG. 13 is a schematic plan view for explaining the configuration of the element formation surface 101 according to a modification.

Further, as illustrated in FIG. 3, the plurality of via conductors 123 are arranged zigzag to make the Y-direction positions of two via conductors adjacent in the X-direction differ from each other, so that it is possible to increase the number of turns of the compensating coil 120 while ensuring the distance between two adjacent via conductors 123. However, in the present invention, the plurality of via conductors 123 need not necessarily be arranged zigzag and may be arranged in a row in the X-direction as the modification illustrated in FIG. 13 depending on the required number of turns of the compensating coil 120 or the design rule of the via conductors 123.

Figure 14:
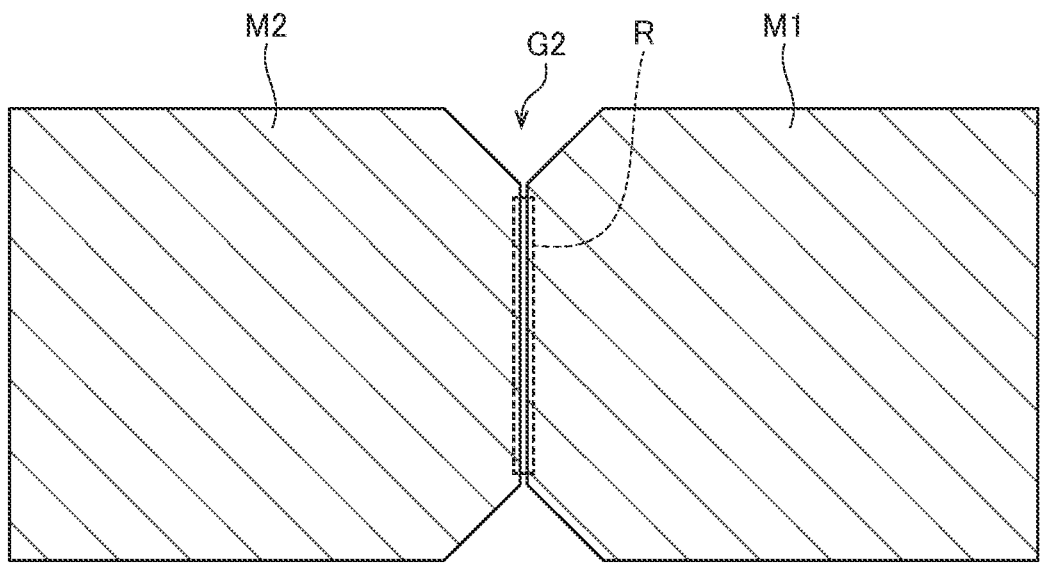
FIG. 14 is a schematic plan view for explaining the shape of the magnetic layers M1 and M2 according to a modification.
Figure 15:
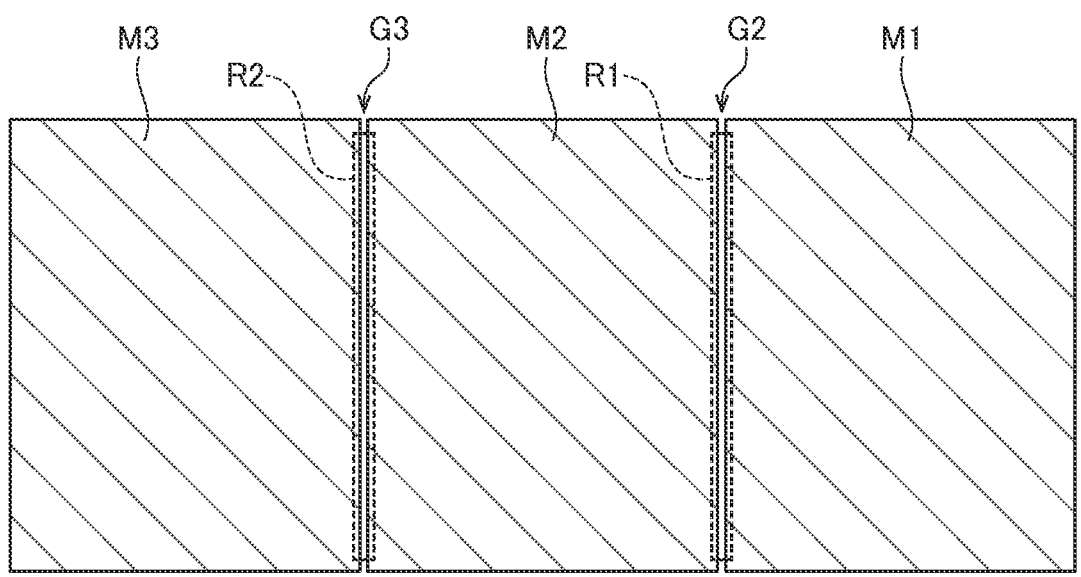
FIG. 15 is a schematic plan view for explaining the configuration of the element formation surface 101 according to a modification.

Further, there is also no particular restriction on the planar shape of each of the magnetic layers M1 and M2, and as the modification illustrated in FIG. 14, the magnetic layers M1 and M2 may each have a narrowed shape in which the width thereof in the Y-direction decreases toward the magnetic gap G2. Further, as the modification illustrated in FIG. 15, three magnetic layers M1, M2, and M3 may be provided and wherein magnetosensitive elements R1 and R2 may be disposed in the vicinity of the magnetic gap G2 formed by the magnetic layers M1 and M2 and in the vicinity of a magnetic gap G3 formed by the magnetic layers M2 and M3, respectively.

FIG. 16 is a graph illustrating the relation between the positional relation between the magnetosensitive element R and the lower layer pattern 121 in the X-direction and the generation efficiency of a canceling magnetic field. The horizontal axis in FIG. 16 represents the difference between the center position of the magnetosensitive element R in the X-direction and the center position of one of the lower layer pattern 121 that is positioned closest to the magnetosensitive element R. Assume here that the width of the magnetosensitive element R in the X-direction is 5 μm and the width of the lower layer pattern 121 in the X-direction is 30 μm. In this case, when the center positions of the magnetosensitive element R and lower layer pattern 121 coincide with each other (FIG. 17A), the difference between the center positions is 0 μm; when the center position of the magnetosensitive element R and the edge of the lower layer pattern 121 coincide with each other (FIG. 17B), the difference between the center positions is 15 μm; and when the magnetosensitive element R and lower layer pattern 121 do not overlap each other and coincide with each other at their edges, the difference between the center positions is 17.5 μm. As can be seen from FIG. 16, as the X-direction positions of the magnetosensitive element R and lower layer pattern 121 become closer to each other, the generation efficiency of a canceling magnetic field becomes higher, and when the center positions of the magnetosensitive element R and lower layer pattern 121 coincide with each other, the generation efficiency of a canceling magnetic field becomes highest. The same applies to the overlap between the magnetosensitive element R and the upper layer pattern 122. That is, by making one of the lower and upper layer patterns 121 and 122 overlap the magnetosensitive element R in a plan view and by bringing the center positions in the X-direction of one of the lower and upper layer patterns 121 and 122 that overlaps the magnetosensitive element R and the magnetosensitive element R close to each other, the generation efficiency of a canceling magnetic field is improved.

Figure 18:
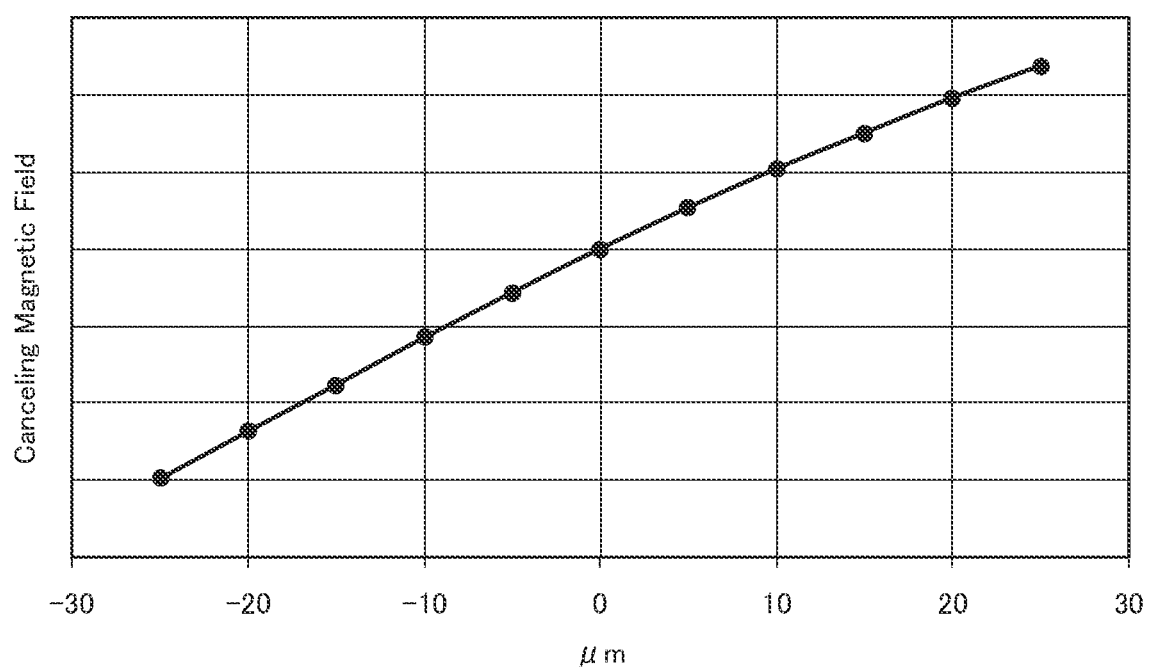
FIG. 18 is a graph illustrating the relation between the positional relation between the edge of each of the magnetic layers M1 and M2 in the X-direction and the edge of the compensating coil 120 in the X-direction and the generation efficiency of a canceling magnetic field.
Figure 19A:
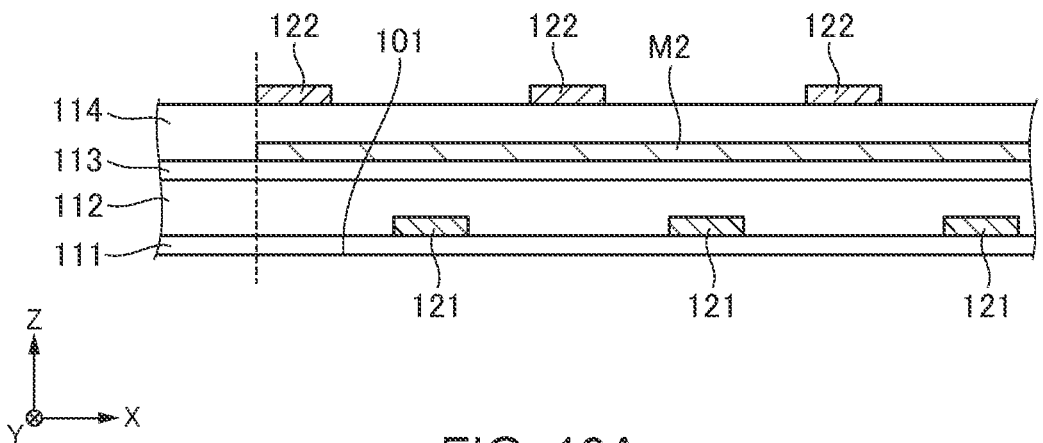
FIGS. 19A and 19B are schematic diagrams for explaining a positional relation in the X-direction between the edge of the magnetic layer M2 and the edge of the upper layer pattern 122.
Figure 19B:
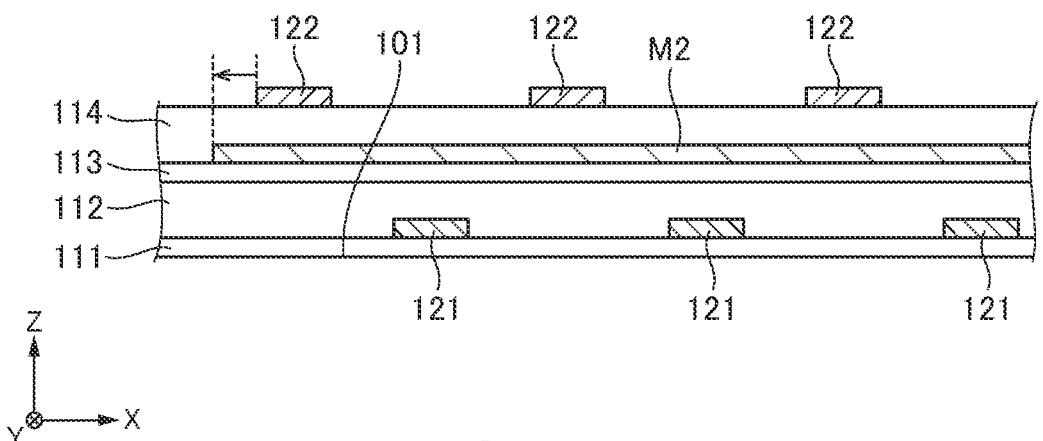

FIG. 18 is a graph illustrating the relation between the positional relation between the edge of each of the magnetic layers M1 and M2 in the X-direction and the edge of the compensating coil 120 in the X-direction and the generation efficiency of a canceling magnetic field. The horizontal axis in FIG. 18 represents the difference between the edge of each of the magnetic layers M1 and M2 in the X-direction and the edge of the compensating coil 120 in the X-direction. The edge of each of the magnetic layers M1 and M2 in the X-direction refers to the edge positioned on the side opposite the edge on the magnetic gap G2 side. For example, when the edges of the magnetic layer M2 and upper layer pattern 122 in the X-direction coincide with each other (FIG. 19A), the difference between the edges is 0 μm. When the edge of the magnetic layer M2 protrudes from the edge of the upper layer pattern 122 in the X-direction (FIG. 19B), that is, when the edge of the upper layer pattern 122 in the X-direction is closer to the magnetic gap G2 than the edge of the magnetic layer M2, the difference between the edges is a positive value. As can be seen from FIG. 18, the larger a value on the horizontal axis is, the higher the generation efficiency of a canceling magnetic field becomes.

While the preferred embodiment of the present disclosure has been described, the present disclosure is not limited to the above embodiment, and various modifications may be made within the scope of the present disclosure, and all such modifications are included in the present disclosure.

The technology according to the present disclosure includes the following configuration examples but not limited thereto.

A magnetic sensor according to the present disclosure includes: first and second magnetic layers opposed to each other through a magnetic gap; a magnetosensitive element disposed on a magnetic path formed by the magnetic gap; and a compensating coil wound around the first and second magnetic layers, wherein the first magnetic layer, second magnetic layer, magnetosensitive element, and compensating coil are integrated in a sensor chip.

According to the present disclosure, the compensating coil integrated in the sensor chip is wound around the magnetic layer, so that the generation efficiency of a canceling magnetic field can be improved. This reduces the amount of current to be made to flow in the compensating coil, so that it is possible to reduce not only power consumption but also thermal noise of the magnetosensitive element.

In the present disclosure, the sensor chip may have first, second, third, and fourth layers stacked in this order, the compensating coil may include a plurality of lower layer patterns formed in the first layer and a plurality of upper layer patterns formed in the fourth layer, the magnetosensitive element may be formed in the second layer, and the first and second magnetic layers may be formed in the third layer. This makes it possible to improve the generation efficiency of a canceling magnetic field and to efficiently apply a magnetic field to be detected to the magnetosensitive element.

In the present disclosure, of a plurality of via conductors connecting the lower and upper layer patterns, two via conductors adjacent in a direction perpendicular to the extending direction of the magnetic gap may be different in position in the extending direction of the magnetic gap. This increases the distance between the two adjacent via conductors, thereby facilitating design and manufacture.

In the present disclosure, one of the plurality of lower layer patterns or one of the plurality of upper layer patterns may overlap the magnetosensitive element in a plan view. This allows a canceling magnetic field t be efficiently applied to the magnetosensitive element.

In the present disclosure, the first and second magnetic layers may each have a first edge constituting one end thereof in a first direction perpendicular to the extending direction of the magnetic gap and positioned on the side close to the magnetic gap and a second edge constituting the other end thereof in the first direction and positioned on the side opposite to the first edge, and the edge of the compensating coil in the first direction may coincide with the second edge or may be positioned closer to the magnetic gap than the second edge. This improves the generation efficiency of a canceling magnetic field.

The magnetic sensor according to the present disclosure may further have a first external magnetic member covering the first magnetic layer and a second external magnetic member covering the second magnetic layer. This can achieve a higher magnetism collecting effect.

As described above, according to the present disclosure, there can be provided a magnetic sensor with improved generation efficiency of a cancelling magnetic field.

What is claimed is:

1. A magnetic sensor comprising:
   first and second magnetic layers opposed to each other through a magnetic gap;
   a magnetosensitive element disposed on a magnetic path formed by the magnetic gap; and
   a compensating coil wound around the first and second magnetic layers,
   wherein the first magnetic layer, second magnetic layer, magnetosensitive element, and compensating coil are integrated in a sensor chip.

2. The magnetic sensor as claimed in claim 1,
   wherein the sensor chip has first, second, third, and fourth layers stacked in this order,
   wherein the compensating coil includes a plurality of lower layer patterns formed in the first layer and a plurality of upper layer patterns formed in the fourth layer,
   wherein the magnetosensitive element is formed in the second layer, and
   wherein the first and second magnetic layers are formed in the third layer.

3. The magnetic sensor as claimed in claim 2,
   wherein the sensor chip further has a plurality of via conductors connecting the lower layer patterns and the upper layer patterns,
   wherein the magnetic gap extends in a first direction;
   wherein two of the plurality of via conductors adjacent in a second direction perpendicular to the first direction are different in position in the first direction.

4. The magnetic sensor as claimed in claim 2, wherein one of the plurality of lower layer patterns or one of the plurality of upper layer patterns overlaps the magnetosensitive element in a plan view.

5. The magnetic sensor as claimed in claim 1,
   wherein the magnetic gap extends in a first direction,
       wherein each of the first and second magnetic layers has a first edge constituting one end thereof in a second direction perpendicular to the first direction and positioned on a side close to the magnetic gap and a second edge constituting other end thereof in the second direction and positioned on a side opposite to the first edge, and
       wherein an edge of the compensating coil in the second direction coincide with the second edge or positioned closer to the magnetic gap than the second edge.

6. The magnetic sensor as claimed in claim 1, further comprising:
   a first external magnetic member covering the first magnetic layer; and
   a second external magnetic member covering the second magnetic layer.

7. The magnetic sensor as claimed in claim 1, further comprising a first dummy element arranged so as to overlap the first magnetic layer,
   wherein the magnetosensitive element and the first dummy element are connected in series.

8. The magnetic sensor as claimed in claim 7, wherein the first dummy element completely overlaps the first magnetic layer.

9. The magnetic sensor as claimed in claim 7, further comprising second and third dummy elements arranged so as to overlap the first or second magnetic layer,
   wherein the magnetosensitive element and the first to third dummy elements are bridge-connected so as to obtain a pair of detection signals.

10. A magnetic sensor comprising:
    first and second magnetic layers arranged in a first direction so as to form a magnetic gap extending in a second direction perpendicular to the first direction;

a magnetosensitive element arranged so as to overlap the magnetic gap as viewed in a third direction perpendicular to the first and second directions;

first and second lower conductive patterns formed on a lower conductive layer and extending in the second direction; and first and second upper conductive patterns formed on an upper conductive layer extending in the second direction, wherein the first and second magnetic layers and the magnetosensitive element are arranged between the lower conductive layer and the upper conductive layer in the third direction, wherein the first lower conductive pattern overlaps the first magnetic layer, wherein the second lower conductive pattern overlaps the second magnetic layer, wherein the first upper conductive pattern overlaps the first magnetic layer, wherein the second upper conductive pattern overlaps the second magnetic layer, wherein an end of the first lower conductive pattern in the second direction is connected to an end of the first upper conductive pattern in the second direction, and wherein an end of the second lower conductive pattern in the second direction is connected to an end of the second upper conductive pattern in the second direction.

11. The magnetic sensor as claimed in claim 10, further comprising third and fourth lower conductive patterns formed on the lower conductive layer and extending in the second direction, wherein the third lower conductive pattern overlaps the first magnetic layer, wherein the fourth lower conductive pattern overlaps the second magnetic layer, wherein an end of the third lower conductive pattern in the second direction is connected to another end of the first upper conductive pattern in the second direction, and wherein an end of the fourth lower conductive pattern in the second direction is connected to another end of the second upper conductive pattern in the second direction.

12. The magnetic sensor as claimed in claim 11, wherein the first to fourth lower conductive patterns and the first and second upper conductive patterns are connected in series.

13. The magnetic sensor as claimed in claim 10, further comprising a dummy element arranged so as to overlap the first magnetic layer, wherein the magnetosensitive element and the dummy element are connected in series.

14. The magnetic sensor as claimed in claim 13, wherein the dummy element completely overlaps the first magnetic layer.

15. The magnetic sensor as claimed in claim 14, wherein the dummy element has a same configuration as the magnetosensitive element.

* * * * *